United States Patent [19]

Dingwall

[11] 4,189,782
[45] Feb. 19, 1980

[54] MEMORY ORGANIZATION

[75] Inventor: Andrew G. F. Dingwall, Bridgewater, N.J.

[73] Assignee: RCA Corporation, New York, N.Y.

[21] Appl. No.: 931,530

[22] Filed: Aug. 7, 1978

[51] Int. Cl.$^2$ .............................................. G11C 11/40
[52] U.S. Cl. ................................. 365/190; 307/238; 365/156; 365/188
[58] Field of Search .................. 307/238, 279, 251; 365/156, 182, 188, 190

[56] References Cited

U.S. PATENT DOCUMENTS 4,063,225   12/1977   Stewart ........................... 365/182

Primary Examiner—Terrell W. Fears
Attorney, Agent, or Firm—H. Christoffersen; Henry I. Schanzer

[57] ABSTRACT

An improved READ/WRITE circuit for a memory array of cells arranged in rows and columns, where each cell is coupled to a bit line via the conduction path of a single gating transistor which conducts in the source follower mode for one binary condition. The circuit includes a voltage multiplying circuit having an output at which is selectively produced either a read voltage, or a write voltage of significantly greater amplitude than the read voltage. The output of the voltage multiplying circuit is coupled via a level shifting decoder circuit, which passes either the read or the write voltage, to the control electrodes of selected gating transistors. The read voltage applied to the control electrode of a gating transistor turns it on just enough to enable the non-destructive-readout (NDRO) of the contents of its associated memory cell. The application of the write voltage to the control electrode of a gating transistor overdrives it into conduction, enabling information to be easily and safely written into its associated memory cell even at low power supply voltages.

9 Claims, 5 Drawing Figures

MEMORY ORGANIZATION

This invention relates to semiconductor memory arrays and, in particular, to means for easily writing information into cells of memory arrays and to means for non-destructively reading the contents of the cells.

In the design of large memory arrays, a critical parameter is the largest number of memory cells that can be put on a chip, i.e., the packing density. To achieve a high packing density, the number of devices per memory cell must be small and the number of lines to access the cells must be as few as possible.

A known static memory cell which satisfies these general requirements includes five (5) transistors per cell and is shown, for example in FIG. 5 of U.S. Pat. No. 3,521,242 entitled, "Complementary Transistors Write and NDRO for Memory Cell". Four of the five transistors are connected to form a flip-flop. The fifth transistor referred to herein as the "gating" transistor functions as a transmission gate. Its conduction path is connected between a single input-output (I/O) point to the flip-flop and an I/O line and it is used either to sense the state of the cell or to write information into the cell. The cell has many advantages in that it is small, it can be selected by one word line connected to the control electrode of the gating transistor, and information can be written into the cell and its contents can be sensed by means of the one I/O line.

However, accompanying these advantages are many problems and conflicting design requirements. To write into the cell, the impedance of the gating transistor must be made as low as possible to enable the cell to change state and to accept new information during a write operation. But, when reading the information contained in the cell, it is necessary that the gating transistor have a relatively high impedance in order to prevent residual voltages on the I/O line from overriding and altering the contents of the memory cell. However, the high impedance of the gating transistor severely limits the ability to write into the cell, particularly at low supply voltages.

Techniques have been developed in the prior art for minimizing the above problem. One technique is to make the impedance of the gating transistor high so the cell can be read out non-destructively. When it is desired to write information into the cell various approaches may be used. U.S. Pat. No. 3,521,242, mentions overdriving the control electrode of the gating transistor to lower the impedance of its conduction path to ensure tighter coupling. This, however, requires the availability of a high amplitude potential, or the generation of a higher amplitude potential than the memory cell operating potential. In addition to the problem of generating the different voltages to read and to write there is the problem of coupling the read and write voltages to the control electrodes of selected gating transistors.

In circuits embodying the invention these problems are uniquely resolved by the combination of:

(a) a voltage multiplying circuit having an output at which is selectively produced either a read voltage or a write voltage of significantly greater amplitude than the read voltage; and (b) a level shift decoder circuit operable at either the read or the write voltage which passes the output of the voltage multiplying circuit to the control electrodes of selected gating transistors.

Figure 1:
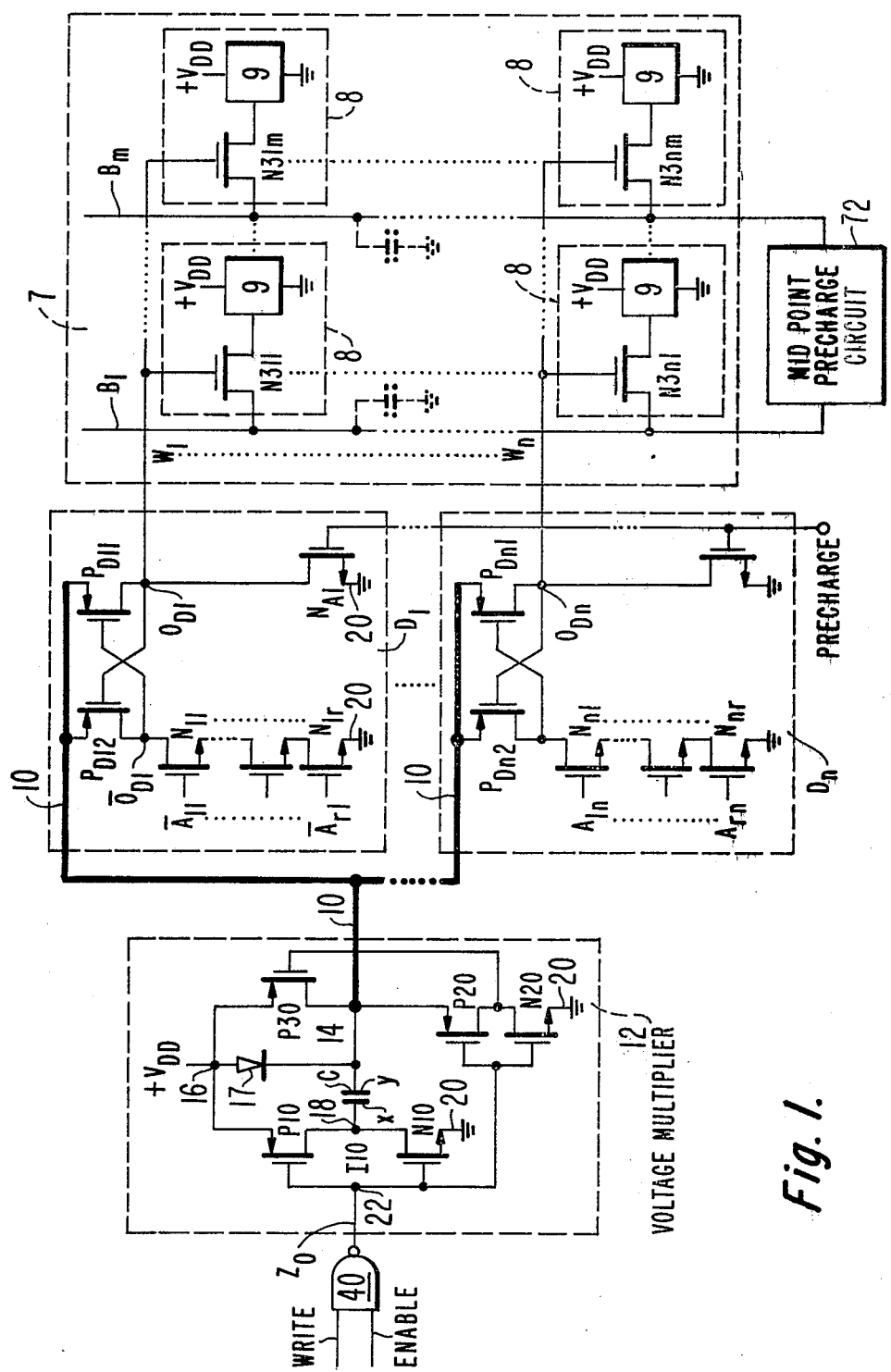
FIG. 1 is a semi-schematic semi-block diagram of a memory array embodying the invention.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P type transistor its gate voltage ($V_G$) has to be more negative than its source voltage ($V_S$) by at least $V_T$. To turn on a N type transistor its $V_G$ has to be more positive than its $V_S$ by $V_T$.

3. IGFETS are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{DD}$ or $+V$ volts is arbitrarily defined as a logic "1" or "high" condition.

FIG. 1 includes a word organized memory array 7, of cells 8, whose word lines (W1 ... Wn) are selectively coupled via level shifting decoders (D1 ... Dn) to a read/write(R/W) voltage line 10. The voltage applied to line 10 is generated by a voltage multiplier (VM) circuit 12 whose output 14 is connected to line 10. VM 12 of FIG. 1 functions to supply $+V_{DD}$ volts to line 14 during read cycles (i.e. when the contents of memory array 7 are being read) and functions to supply approximately $+2V_{DD}$ volts to line 14 during write cycles (i.e. when information is being written into cells) of array 7.

Figure 3:
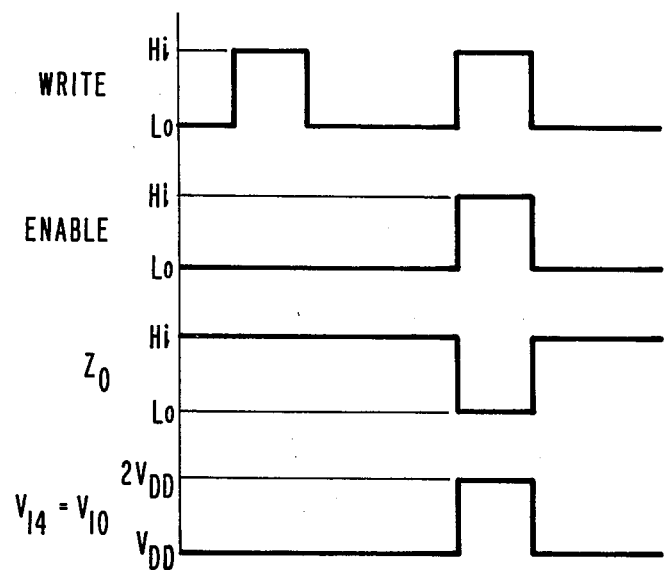
FIG. 3 is a diagram of waveforms generated at various nodes of the circuit of FIG. 1.

VM 12 is, similar to the circuit shown in FIG. 3 of U.S. Pat. No. 4,000,412 issued to the present Applicant.

The need to generate these potentials ($+V_{DD}$ volts and $+2V_{DD}$ volts) is best understood by first examining some characteristics of the memory cells.

Figure 2A:
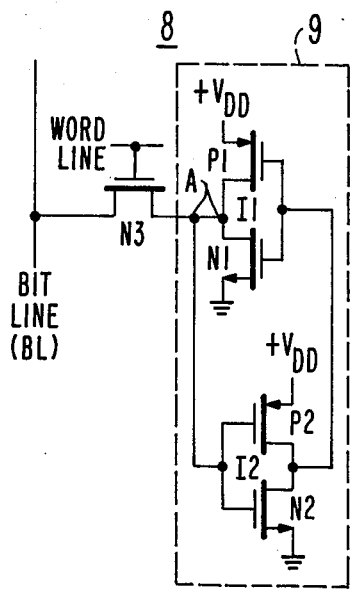
FIG. 2A is a schematic diagram of a memory cell used in the array of FIG. 1.
Figure 2B:
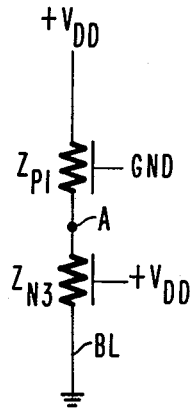
FIGS. 2B and 2C are equivalent diagrams of the memory cell under certain operating conditions.
Figure 2C:
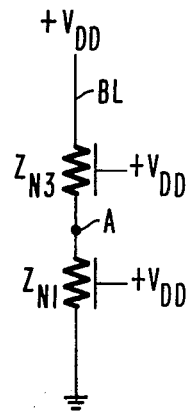

The memory cells 8 are designed such that when $V_{DD}$ volts is applied to the control electrode of their gating transistors (N3) the storage element 9 of the cell cannot change state (i.e. it is not subject to "False-Write"). This is best explained by reference to FIG. 2.

The storage element or flip-flop includes two cross-coupled complementary inverters I1 and I2. Each inverter includes two IGFETs of complementary conductivity type having their source-drain paths connected in series between $V_{DD}$ and ground. The interconnected drains of IGFETs P1 and N1, forming inverter I1, are connected in common with the interconnected gates of IGFET P2 and N2 to the input-output (I/O) point A of the flip-flop. The interconnected drains of P2 and N2, forming inverter I2, are connected to the interconnected gates of P1 and N1. The interconnected gates of each inverter defines the inverter signal input point and the interconnected drains of each inverter defines the inverter signal output point. The conduction path of a gating IGFET N3 is connected between the input-output (I/O) line also designated as the bit line, BL, and the Input-Output (I/O) point, A, of the flip-flop. A word (or address) line is connected to the control (gate) electrode of N3. The potential on the word line controls the conductivity of N3. The impedance of the conduction path of an IGFET is a function of its gate-to-source voltage ($V_{GS}$). Assume that, for the sample amplitude of $V_{GS}$ applied in a direction to turn on the transistors, the ON impedance ($Z_{N3}$) of the conduction path of gating transistor N3 is greater than the ON impedance ($Z_{N2}$) of transistor N2 and also greater than the ON impedance ($Z_{P1}$) of transistor P1. Assume also that the "flip-point" of inverters I1 and I2 is $V_{DD}/2$. That is, for an input to inverter I1 or I2 more positive than $V_{DD}/2$ its output is assumed to be "zero" or "Low" and for an input less positive than $V_{DD}/2$ each inverter output is assumed to be "$+V_{DD}$" or "High".

It will now be shown that for the conditions listed above and with the word line at $V_{DD}$ (same operating voltage as applied to flip-flop 9) that the state of the cell cannot be changed, i.e. is not writeable. The operation of the memory cell is now examined for the two conditions which can cause the memory to be disturbed.

One condition exists when a logic "1" is stored in the cell (P1 and N2 on, N1 and P2 off) and the bit line capacitance is charged to zero volts. For this condition, the conduction paths of P1 and N3 may be considered to be in series (see FIG. 2B) between $V_{DD}$ and ground, and both transistors are conducting in the common source mode. Since $Z_{N3}$ is greater than $Z_{P1}$ the voltage, $V_A$, at node A remains above $V_{DD}/2$ and a logic "1" remains stored in FF 9.

The other possible disturb condition exists when the cell is storing a logic "0" (P1 and N2 off, N1 and P2 on) and the bit line capacitance is charged to $V_{DD}$ volts. When $V_{DD}$ volts is applied to the gate of N3, the latter turns on. But, for this signal condition N3 conducts in the source follower mode and $Z_{N3}$ is distinctly greater than $Z_{N1}$. Hence, $V_A$ remains below $V_{DD}/2$ when N3 is turned on and the cell is not disturbed.

The cell, however, is difficult to write especially at low supply voltages (e.g., $V_{DD}=2$ or 3 volts) and for the condition when a high is to be written into the cell. For this condition, the gating transistor conducts in the source follower mode and there is a threshold voltage ($V_T$) offset between its gate and source. If $V_T$ is equal to $V_{DD}$ then the cell can not be written. But, even if $V_T$ is somewhat less than $V_{DD}$ (applied to the gate of N3) the impedance of N3 is high and the cell is very slow to write.

Consequently, to reliably write into the cell the impedance of N3 must be decreased during the write cycle. This is achieved by overdriving into conduction the gate of the gating transistors when information is to be written into a memory cell.

For $V_{DS}<V_T$ (i.e. the linear range of operation) the impedance (Z) of the conduction path of an IGFET may be expressed as:

$$Z=K[1/V_{GS}-V_T]\qquad\text{eq. 1}$$

For $V_{DS}>V_T$ (i.e. the saturation range of operation) the Z of the conduction path of an IGFET may be expressed as:

$$Z=K[1/(V_{GS}-V_T)^2]\qquad\text{eq. 2}$$

It can be discerned from equation 1 that if $V_{GS}$ is doubled (from $V_{DD}$ to $2V_{DD}$) that Z is decreased by more than a factor of two (2) since $V_T$ relatively constant. It can be further discerned from equation 2 that if $V_{GS}$ is doubled that Z is decreased by more than a factor of four (4). Overdriving the gate greatly increases the range of power supply voltage over which information can be written into the memory cell.

Assume now that when a voltage of $2V_{DD}$ is applied to the word line that $Z_{N3}$ is substantially less than $Z_{P1}$ or $Z_{N1}$. For this condition $+V_{DD}$ on the bit line results in more than $V_{DD}/2$ being applied to point A; and 0 volts on the bit line results in less than $V_{DD}/2$ being applied to point A. Clearly then, the binary information on the bit line will be written into the cell. The application of $2V_{DD}$ volts to a word line causes all the gating transistors whose control electrodes are connected to that line to be overdriven into conduction. Thus, while the selected cells of a selected row are now easily written, the unselected cells are subject to false write. This problem is overcome by (prior to writing or reading) precharging the bit lines of unselected cells to a potential which is approximately equal to the flip point of the memory cells (i.e. the point at which node A of a cell neither sources nor sinks current) which, by way of example may be assumed to be $V_{DD}/2$. A mid point precharge circuit 72 coupled to each bit line can perform this function. Circuit 72 could be any one of a number of voltage divider circuits coupled between $V_{DD}$ and ground having an output node at which a portion of $V_{DD}$ is produced and which output node can be selectively applied to a bit line. The problem may also be overcome by controlling the rate at which the word line voltage is applied. By ramping-up the word line voltage a memory cell can charge its associated bit-line without being disturbed. With either of these methods, but particularly with the precharge scheme, the impedance of N3 can be reduced below the level required for absolute non-writeability, assumed in the discussion above.

In the above discussion it was presumed, for ease of explanation, that the impedances of the transistors forming a memory cell were so ratioed that the cell was absolutely non-writeable (was not subject to false write) for any combination of signals on the bit lines and on the word lines which were in the range (0 to $+V_{DD}$) of the operating voltage applied to the memory cell. Precharging the bit lines of unselected cells to $V_{DD}/2$ volts prior to each write cycle and precharging all the bit lines of the array prior to each read cycle enables the impedance of N3 to be reduced. This improves the response time of the cell without the problem of false write or destructive read out. The application of $2V_{DD}$ to the gate electrodes of selected devices ensures that information will be written into the cell at low $V_{DD}$ voltages even for that value of binary input (e.g. High on bit line) for which the gating transistor conducts in the source follower mode.

The combination of the voltage multiplier 12 and the level shift decoding circuitry of FIG. 1 enables the application of $V_{DD}$ volts or $2V_{DD}$ volts to selected word lines to which the control electrodes of the gating transistors are connected. (During a write cycle the bit lines of unselected memory cells are returned to $V_{DD}/2$ volts by means of mid point precharge circuit 72 to prevent the disturbance of unselected cells.)

The structure and operation of VM 12 is now briefly examined. VM 12 includes a complementary inverter 110 comprised of transistors P10 nd N10. P10 is connected at its source to terminal 16 and at its drain to terminal 18. N10 is connected at its drain to terminal 18 and at its source to terminal 20. The circuit also includes transistors P20, N20, and P30 and a capacitor C. P20 is connected at its source to terminal 14 and at its drain to the drain of N20 and to the gate of P30. N20 is connected at its source to terminal 20 while the source-to-drain path of P30 is connected between terminals 16 and 14. The gates of P10, P20, N10 and N20 are connected in common to the input control line 22 of VM 12. One plate of capacitor C referred to as plate X or "X" is connected to terminal 18 and the other plate of C referred to as plate Y or "Y" is connected to terminal 14. The value of the capacitor C is chosen to be approximately 5 times the value of the capacitance on line 10. This ratio of capacitance ensures that a voltage pulse of $+2V_{DD}$ volts can be developed and applied to line 10 without significant attenuation and ensures that the voltage levels on line 10 are maintained during the pulse period. The capacitor may be an integrated, on chip, component or a discrete, off chip, component. A diode 17 is connected between terminal 16 and node 14 to ensure tight coupling when $V_{DD}$ is supplied to node 14 and to prevent node 14 from floating when P30 is turned off.

A potential of $+V_{DD}$ volts is applied to terminal 16 and ground potential (0 volts) is applied to terminal 20. The VM circuit 12 is controlled by means of a two input NAND gate 40 whose output $Z_0$ is connected to input line 22. The two inputs to NAND gate 40 are designated WRITE and ENABLE and are normally LOW (logic "0").

The operation of VM 12 is described in detail in U.S. Pat. No. 4,000,412 and need not be detailed here. Suffice it to say that when the WRITE and ENABLE inputs are low, $Z_0$ is HIGH, transistors N10 and N20 are turned on, and that when N20 is turned on it turns on transistor P30. When P30 is turned on node 14, and plate Y of capacitor C are clamped to $+V_{DD}$ volts. Whenever N10 is conducting plate X of capacitor C is at ground potential and $+V_{DD}$ volts to applied to enhance voltage line 10. This is the condition that exists during a read or precharge cycle.

To write information into the memory, the WRITE and ENABLE signals applied to NAND gate 40 must be high (Logic "1") causing $Z_0$ to go low (Logic "0"). This is shown in the waveform diagram of FIG. 3. When $Z_0$ goes low, transistors N10 and N20 are turned off and transistors P10 and P20 are turned on. The turn on of transistor P10 causes a positive voltage step of $+V$ volts to be applied to plate X. Since the potential across C cannot charge instantaneously, the potential at Y goes from $+V_{DD}$ volts to $2V_{DD}$ volts. P20 being on couples the $2V_{DD}$ volts at plate Y to the gate of transistor P30 turning it off or keeping it turned off. Thus, whenever $Z_0$ goes LOW, the potential at node 14 ($V_{14}$) swings from $V_{DD}$ volts to $2V_{DD}$ volts and remains at $2V_{DD}$ for the period $Z_0$ is low.

VM 12 is well suited to practice the invention but any other suitable voltage multiplier having an output terminal at which is normally supplied an operating potential of, for example, $+V_{DD}$ volts and which can be selectively pulsed to produce at its output a multiple (e.g. $+2V_{DD}$ volts) of the operating voltage could be used instead.

In FIG. 3 the $30V_{DD}$ write pulse is applied coincident with the full WRITE and ENABLE pulse. However, it should be appreciated that the Enhanced write voltage (e.g. $+2V_{DD}$) could be applied at any time during the write pulse or even at the trailing edge of the Write pulse by controlling the Write or Enable pulse or by other suitable modifications, known in the art.

The voltage present on line 10 can be selectively applied to word lines W1 through Wn of array 7 by means of decoders D1 through Dn. Each decoder, Di, where $1 \leq i \leq n$, includes a decoding arrangement of a number "r" of N type transistors ($N_{i1} \ldots N_{ir}$) having their conduction paths connected in series between a node $\overline{O_{Di}}$ and ground. The gate electrodes of each one of the decoding transistors ($N_{D1} \ldots N_{Dr}$) is connected to a different one of "r" input address lines ($A_{1i} \ldots A_{ri}$) carrying binary coded information. When all the signals applied to the gate electrodes of the decoding circuits are high, transistors $N_{i1}$ through $N_{ir}$ are turned on and the output node $\overline{O_{Di}}$ is clamped to ground potential.

Each decoder includes two cross-coupled transistors $P_{Di1}$ and $P_{Di2}$. The sources of the two transistors are connected to line 10 while the drain of transistor $P_{Di1}$ is connected to its decoder output node $O_{Di}$ and the drain of transistor $P_{Di2}$ is connected to its complementary decoder output node $\overline{O_{Di}}$. A discharge transistor ($N_{Ai}$) is connected between each $O_{Di}$ node and terminal 20. In response to a positive going precharge pulse, applied to the gates of the discharge transistors, nodes $O_{Di}$ and every word line is discharged to ground potential.

The decoders are identical in structure and operation and for ease of discussion only the operation of Decoder D1 is detailed. Assume that memory cells of Word 1 of array 7 are selected for read or for write. Decoder D1 is selected when all its address inputs $\overline{A_{11}}$ through $\overline{A_{r1}}$ are "HIGH". When this occurs, transistors $N_{11}$ through $N_{1r}$ are turned on. Node $\overline{O_{D1}}$ is then driven "low", turning transistor $P_{D11}$ full on and causing the turn off of $P_{D12}$. $P_{D11}$ conducts in the common source mode and clamps node $O_{D1}$ and line $W_1$ to line 10. Thus, the voltage on line 10, whether it be $V_{DD}$ volts or $2V_{DD}$ volts, is coupled via the low impedance conduction path of $P_{D11}$ to the selected word line $W_1$. The level shift decoder remains in the state $P_{D11}$—ON, $P_{D12}$—OFF until one of the address inputs to D1 goes low and/or discharge transistor NA1 is turned on.

When one or more of the address inputs to D1 is low, D1 is not selected. Assuming the periodic application of a precharge pulse to discharging transistor NA1, node $O_{D1}$ is driven low and held low. $P_{D12}$ is then turned on, $\overline{O_{D1}}$ is clamped to the voltage on line 10 and $P_{D11}$ with essentially zero $V_{GS}$ is turned off and held off. The decoder level shifts in that the input address line voltages may vary between 0 volts (low) and $V_{DD}$ volts (high) but the decoder output may be either zero volts, $V_{DD}$ volts, $2V_{DD}$ volts, or whatever voltage is supplied to line 10.

Therefore, in the circuit embodying the invention, a single voltage multiplier circuit is used to generate one of two voltages and a set of level shift decoders couples the voltage produced at the output of the voltage multiplying circuit onto a selected word line. As, has already been described, the enhanced write voltage enables information to be safely and quickly written into the cells of the array while the normal read voltage enables the non-destructive read out of the memory contents.

What is claimed is:

1. In combination with a memory cell having an input-output (I/O) point and a single gating transistor whose conduction path is connected between said I/O point and a bit line, means for writing information into said cell and means for non-destructively reading the contents of the memory cell comprising:
   first and second power terminals for the application therebetween of an operating potential;
   a voltage multiplier circuit connected between said first and second power terminals having an output node at which is selectively produced either a read voltage which is approximately equal in amplitude to said operating potential or a write voltage which is substantially greater in amplitude and of same polarity as said read voltage; and
   a selectively decoded level shift circuit connected between said output node and the control electrode of said gating transistor for, when selected, coupling the voltage at said output node to the control electrode of said gating transistor.

2. The combination as claimed in claim 1 wherein said memory cell includes first and second inverters, each inverter having a signal input and a signal output and first and second terminals for the application therebetween of an operating potential,
   wherein the signal output of said first inverter and the signal input of said second inverter are connected to said I/O point;
   wherein the signal output of said second inverter is connected to the signal input of said first inverter; and
   wherein said first and second terminals of said inverters are connected to said first and second power terminals, respectively.

3. The combination as claimed in claim 2 wherein each one of said first and second inverters is comprised of first and second insulated-gate field-effect transistors of complementary conductivity type interconnected to form a complementary inverter.

4. The combination as claimed in claim 2 wherein the impedance of the conduction path of said gating transistor is less than the output impedance of said first inverter when said write voltage is applied to the control electrode of said gating transistor.

5. The combination as claimed in claim 1 wherein said selectively decoded level shift circuit includes a transistor having its conduction path coupled between said output node and said control electrode of said gating transistor.

6. The combination as claimed in claim 5 wherein said voltage multiplying circuit includes:
   a capacitor connected at one plate to said output node and at its other plate to the output point of a first, inverter which normally applies the voltage at said second power terminal to said other plate of said capacitor;
   normally conducting means for coupling the voltage at said first power terminal to said output node; and
   means for selectively changing the state of said first inverter for applying the voltage at said first power terminal to said other plate of said capacitor and means for turning off said normally conducting means for producing a potential outside the range of said operating potential at said output node.

7. The combination as claimed in claim 1 wherein said level shift circuit includes:
   two cross-coupled transistors each transistor having a source, a drain and a control electrode; means connecting the sources of said transistors to said output node and the drain of one of said two transistors being coupled to said control electrode of said gating transistor and the drain of the other one of said two cross coupled transistor being coupled to the output of the decoding circuit.

8. The combination as claimed in claim 1 wherein said memory cell includes a inverter connected at its output to said I/O point, and wherein, for the application of said read voltage to the control electrode of said gating transistor and for the application of a voltage of like amplitude to said read voltage across said memory cell inverter, the impedance of the conduction path of said gating transistor is greater than the output impedance of said memory cell inverter.

9. The combination as claimed in claim 8 wherein, for the application of said write voltage to said control electrode of said gating transistor and for the application of said read like voltage across the memory cell inverter, the impedance of the conduction path of the gating transistor is less than the output impedance of said memory cell inverter.

* * * * *

UNITED STATES PATENT AND TRADEMARK OFFICE
CERTIFICATE OF CORRECTION

PATENT NO. : 4,189,782

DATED : February 19, 1980

INVENTOR(S) : Andrew Gordon Francis Dingwall

It is certified that error appears in the above-identified patent and that said Letters Patent is hereby corrected as shown below:

Col. 3, line 33 change "sample" to --- same ---.

Col. 5, line 27 change "nd" to --- and ---.

Col. 6, line 1 change "hance" to --- hanced ---.

Col. 6, line 12 change "$2V_{DD}$" to --- $+2V_{DD}$ ---.

Col. 6, line 25 change "$30V_{DD}$" to --- $+2V_{DD}$ ---.

Col. 6, line 35 change "$1 \leq i \leq n$" to --- $1 \leq i \leq n$ ---.

*Signed and Sealed this*

*Tenth* Day of *June 1980*

[SEAL]

*Attest:*

SIDNEY A. DIAMOND

*Attesting Officer* *Commissioner of Patents and Trademarks*